United States Patent
Lin

(10) Patent No.: US 7,495,258 B2
(45) Date of Patent: Feb. 24, 2009

(54) N-CHANNEL TFT AND OLED DISPLAY APPARATUS AND ELECTRONIC DEVICE USING THE SAME

(75) Inventor: Ching-Wei Lin, Taoyuan (TW)

(73) Assignee: TPO Displays Corp., Chu-Nan (TW)

( * ) Notice: Subject to any disclaimer, the term of this patent is extended or adjusted under 35 U.S.C. 154(b) by 125 days.

(21) Appl. No.: 11/436,264

(22) Filed: May 17, 2006

(65) Prior Publication Data

US 2007/0267662 A1 Nov. 22, 2007

(51) Int. Cl.
*H01L 27/146* (2006.01)
(52) U.S. Cl. .............................. 257/61; 257/59; 257/72; 257/E27.132
(58) Field of Classification Search .................. 257/59, 257/61, 72, E27.132
See application file for complete search history.

(56) References Cited

U.S. PATENT DOCUMENTS 6,614,083 B1 * 9/2003 Yamazaki et al. ........... 257/412
6,621,116 B2 * 9/2003 Church ....................... 257/314
6,727,969 B2   4/2004 Chang et al.
6,747,325 B2   6/2004 Shih
6,818,922 B2  11/2004 Chen
6,888,161 B2   5/2005 Shih
6,951,793 B2  10/2005 Shih
7,002,652 B2   2/2006 Wen et al.
7,009,204 B2   3/2006 Tsai et al.
7,276,730 B2 * 10/2007 Yamazaki et al. ............. 257/59

FOREIGN PATENT DOCUMENTS

TW            200407825         5/2004

* cited by examiner

*Primary Examiner*—Victor A Mandala
(74) *Attorney, Agent, or Firm*—Liu & Liu

(57) ABSTRACT

An N-channel TFT and OLED display apparatus and electronic device using the same are disclosed. The N-channel TFT comprises a a substrate; an active layer on the substrate, wherein the active layer comprises an N type source region and an N type drain region; a gate dielectric layer on the active layer; and a gate region on the gate dielectric layer. At least a part of the highly-doped source region is located under the gate region, and at least a part of the lightly-doped drain region is located under the gate region.

20 Claims, 3 Drawing Sheets

N-CHANNEL TFT AND OLED DISPLAY APPARATUS AND ELECTRONIC DEVICE USING THE SAME

BACKGROUND OF THE INVENTION

1. Field of the Invention

The present invention generally relates to a N-channel TFT, in particular, to an N-channel TFT having unique structure and OLED display apparatus and electronic device using the same.

2. Description of Related Art

Being self-luminous, OLEDs eliminate the need for a backlight that is necessary in liquid crystal display devices (LCDs), and thus they are most suitable when manufacturing thinner devices. Also, the self-luminous OLEDs are high in visibility and have no limit in terms of viewing angle. These are the reasons for the attention that light emitting devices using the OLEDs are receiving in recent years as display devices to replace CRTs and LCDs.

Driving circuits for an OLED display apparatus can be categorized into two kinds, i.e., voltage driving circuits and current driving circuits. However, no matter which kind of driving circuits is used, a thin-film-transistor (TFT) is used as a driving transistor for adjusting OLED current provided to the OLED. Refer to FIG. 1, a circuitry diagram of a conventional OLED pixel is provided. As shown in FIG. 1, the gate terminal of the P-channel TFT 12 is controlled by a control signal passed through the transistor 100 and stored in capacitor 102 for adjusting the OLED current provided to the OLED 14.

Because the luminance of OLED completely depends on the threshold voltage and mobility of the P-channel TFT 14, the display image uniformity is poor even with a little variation of TFT characteristics.

To improve image uniformity, prior arts use N-channel TFT to replace the P-channel TFT for reducing the affection caused by the threshold voltage variation as shown in FIG. 2. Because the current flow through OLED depends on Vgs and Vth of driving N-TFT as well as the voltage across OLED, the negative feedback effect makes current flow through OLED more uniformity, therefore results in better image uniformity. However, the hot-carrier effect makes the N-channel TFT 22 unreliable and therefore the lifetime of the whole circuit is shortened.

SUMMARY OF THE INVENTION

Accordingly, the present invention is directed to an N-channel TFT and OLED display apparatus and electronic device using the same such that the hot-carrier effect can be reduced and the lifetime of the whole circuit can be improved.

The present invention is directed to an N-channel TFT. The N-channel TFT comprises a substrate; an active layer on the substrate, wherein the active layer comprises an N type source region and an N type drain region; a gate dielectric layer on the active layer; and a gate region on the gate dielectric layer. The source region comprises a highly-doped source region, and at least a part of the highly-doped source region is located under the gate region. The drain region comprises a first doped drain region and a second doped drain region, and a dopant concentration of the first doped drain region is lower than the dopant concentration of the second doped drain region. The first doped drain region is a lightly-doped drain region, and at least a part of the lightly-doped drain region is located under the gate region.

In another aspect, the present invention is directed to an OLED display apparatus, which comprises a data driver, a scan driver and an active area. The data driver drives a plurality of data lines while the scan driver drives a plurality of scan lines. The active area comprises a plurality of OLED pixels. At least one of the OLED pixels comprises a control circuit and an OLED element. The control circuit generates a data current in accordance to one data line and one scan line, wherein the control circuit comprises at least one N-channel TFT as mentioned above.

In another aspect, the present invention is directed to an electronic device, which comprises a signal generator for generating image signals used for displaying an image and an OLED display apparatus provided as set forth above.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
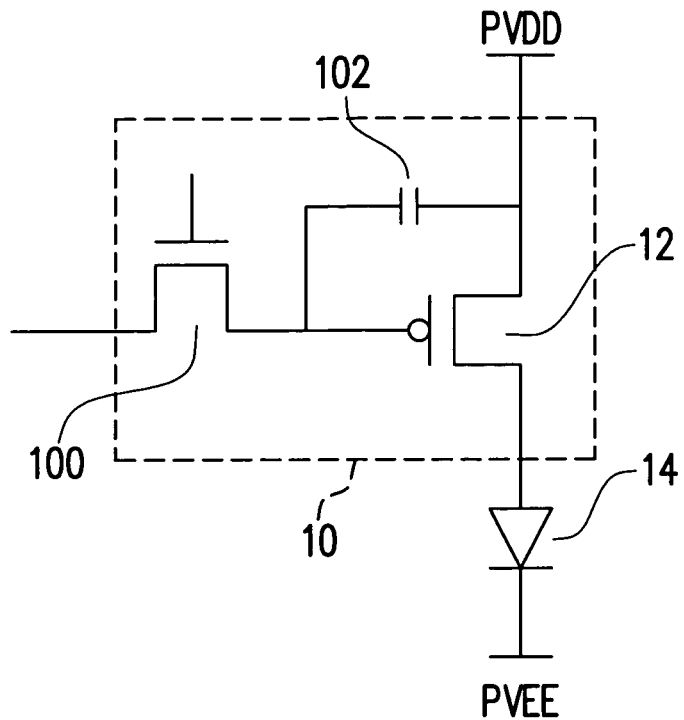
FIG. 1 is a circuitry diagram of a conventional OLED pixel.
Figure 2:
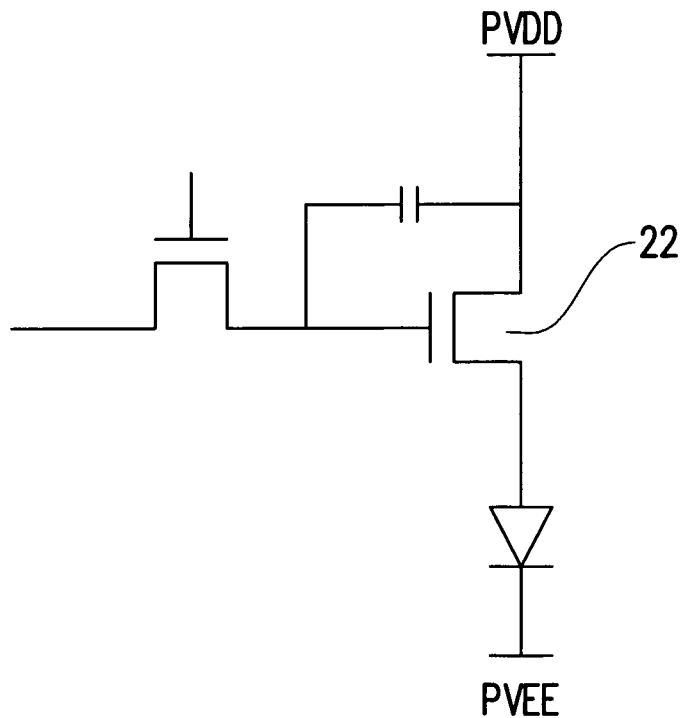
FIG. 2 is a circuitry diagram of another conventional OLED pixel.

Reference will now be made in detail to the present preferred embodiments of the invention, examples of which are illustrated in the accompanying drawings. Wherever possible, the same reference numbers are used in the drawings and the description to refer to the same or like parts.

Figure 3:
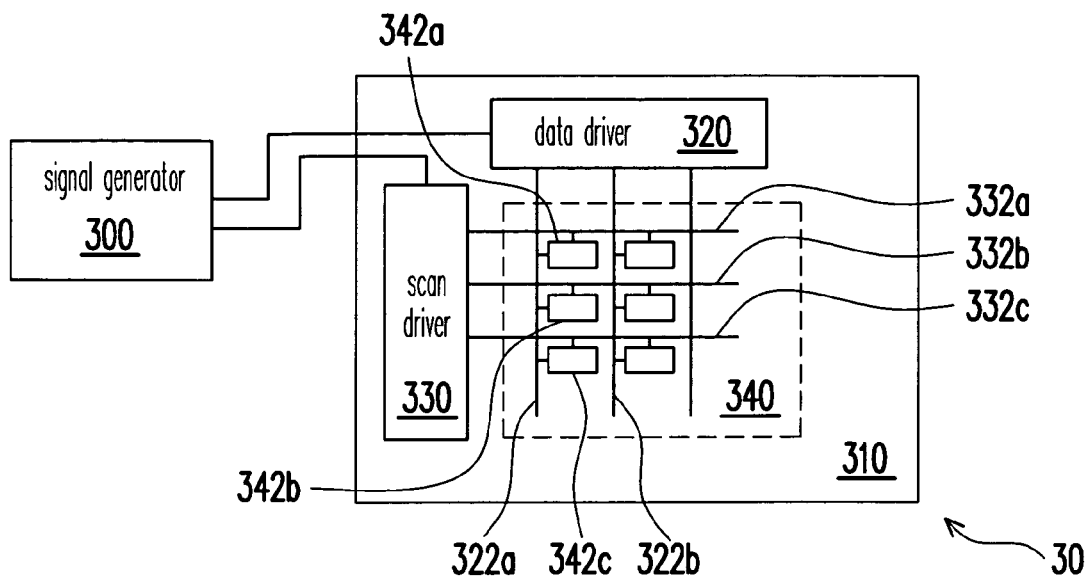
FIG. 3 is a circuitry block diagram shown an electronic device and OLED apparatus used therein according to one embodiment of the present invention.

FIG. 3 is a circuitry block diagram, showing an electronic device and an display apparatus used therein according to one embodiment of the present invention. The electronic device 30 comprises a signal generator 300 and an display apparatus 310. The display apparatus 310 can be an OLED display apparatus, or an LCD display apparatus. The electronic device 30 can be a mobile phone, digital camera, PDA (personal digital assistant), notebook computer, desktop computer, television, car display, or portable DVD player, for example. The signal generator 300 generates image signals and/or control signals used for displaying an image, and sends the image signals and/or control signals to the display apparatus 310.

The display apparatus 310 (for example, the OLED display apparatus) comprises a data driver 320 for driving a plurality of data lines 322a, 322b and etc. in accordance to the image signals, a scan driver 330 for driving a plurality of scan lines 332a, 332b, 332c and etc. in accordance to the control signals, and an active area 340 comprising a plurality of OLED pixels 342a, 342b, 342c and etc. for displaying the image under control of the data lines and scan lines. For normal operation, an OLED pixel is controlled by one of the data lines and one of the scan lines. For example, OLED pixel 342a is controlled by data line 322a and scan line 332a, OLED pixel 342b is controlled by data line 322a and scan line 332b, and OLED pixel 342c is controlled by data line 322a and scan line 332c.

In the embodiment, the OLED pixels can be the one shown in FIG. 3. However, as should be known by those with ordinary skill, other OLED pixels with different driving architectures can be applied here when at least one N-channel TFT is used in the driving architectures.

According to some embodiments of the present invention, the N-channel TFT includes a source region and a drain region. The source region includes a highly-doped source region, and at least a part of the highly-doped source region is located under the gate region. The drain region includes a lightly-doped drain region, and at least a part of the lightly-doped drain region is located under the gate region. The N-channel TFT can serve as a driving TFT or a switching TFT in a display apparatus, for example, in an OLED display apparatus.

Figure 4:
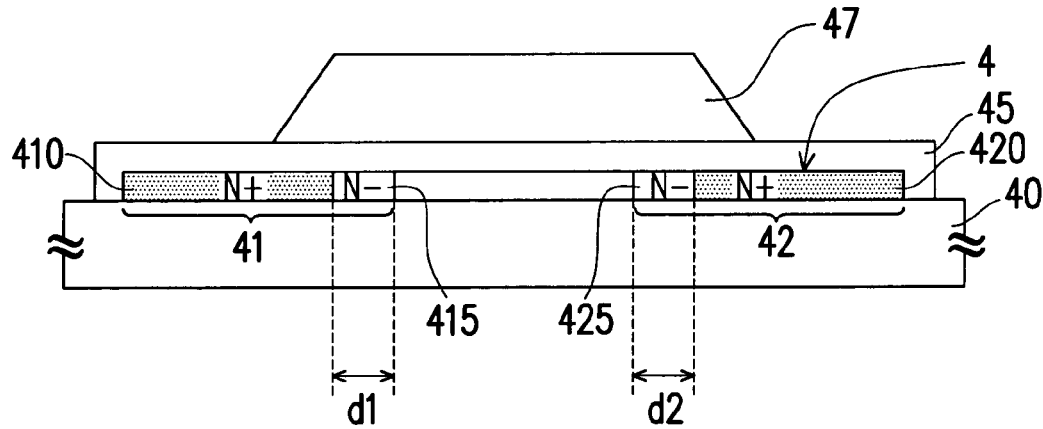
FIG. 4 is a cross-sectional view of an N-channel TFT according to one embodiment of the present invention.

Refer to FIG. 4, a cross-sectional view of an N-channel TFT according to first embodiment of the present invention is provided. In the embodiment, an active layer 4 is formed on a substrate 40. A gate dielectric layer 45 is formed on the active layer 4, and a gate region 47 is formed on the gate dielectric layer 45. The active layer 4 includes a source region 41 and a drain region 42. The source region 41 comprises a highly doped source region 410 and a lightly doped source region 415, wherein the dopant concentration of the lightly doped source region 415 is lower than that of the highly doped source region 410. Similarly, the drain region 42 comprises a highly doped drain region 420 and a lightly doped drain region 425, wherein the dopant concentration of the lightly doped drain region 425 is lower than that of the highly doped drain region 420.

The feature of some embodiments of the present invention resides in that at least a part of the highly-doped source region is located under the gate region, and at least a part of the lightly-doped drain region is located under the gate region. As shown in FIG. 4, a part of the highly-doped source region 41 is located under the gate region 47, and the entire part of the lightly-doped drain region 425 is located under the gate region 47. The overlapping distance d1 that the highly-doped source region 410 overlaps the gate region 47 is not limited. For example, the highly-doped source region 410 can overlap the gate region 47 by at least 1 μm, for example, 1 μm to 3 μm. The overlapping distance d2 that the lightly-doped drain region 425 overlaps the gate region 47 is not limited. For example, the lightly-doped drain region 425 can overlap the gate region 47 by at least 1 μm, for example, 1 μm to 3 μm.

Figure 5:
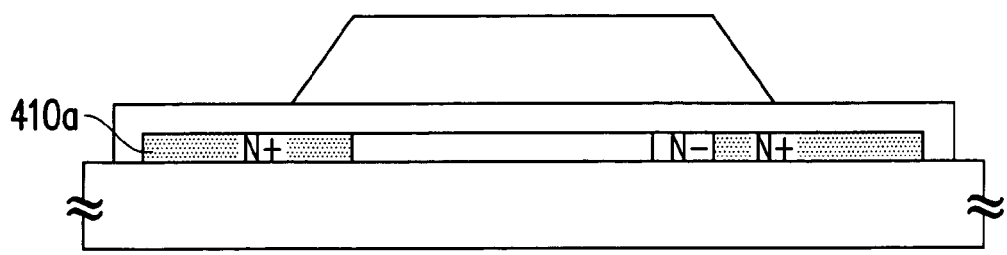
FIG. 5 is a cross-sectional view of an N-channel TFT according to second embodiment of the present invention.
Figure 6:
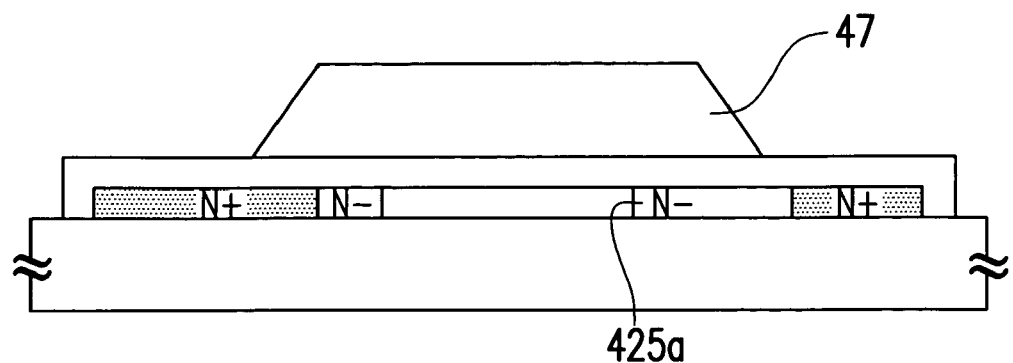
FIG. 6 is a cross-sectional view of an N-channel TFT according to third embodiment of the present invention.

The present invention can be implemented by other structures. For example, refer to FIG. 5, a cross-sectional view of an N-channel TFT according to second embodiment of the present invention is provided. The second embodiment differs from the first embodiment in that the source region comprises the highly doped source region 410a only. Further, refer to FIG. 6, a cross-sectional view of an N-channel TFT according to third embodiment of the present invention is provided. The third embodiment differs from the first embodiment in that only a part of the lightly doped drain region 425a is under the gate region 47.

Figure 7:
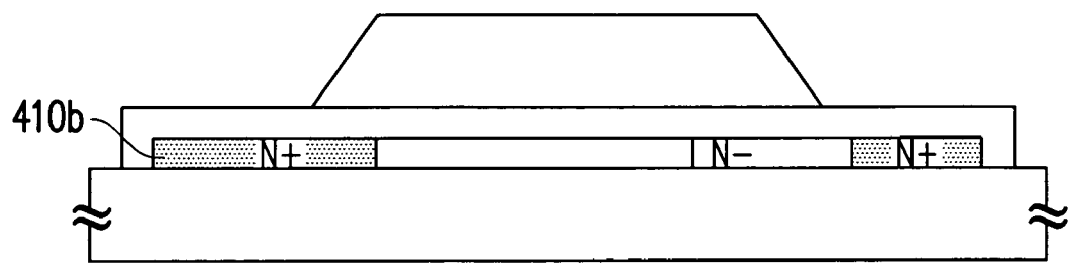
FIG. 7 is a cross-sectional view of an N-channel TFT according to fourth embodiment of the present invention.
Figure 8:
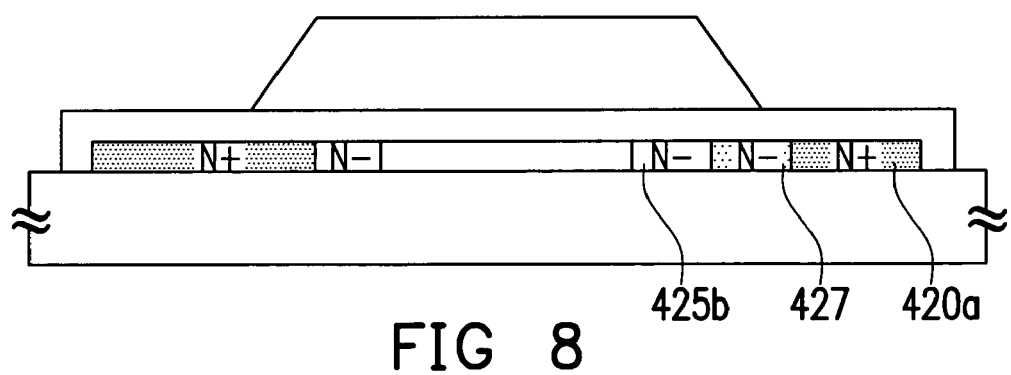
FIG. 8 is a cross-sectional view of an N-channel TFT according to fifth embodiment of the present invention.

Moreover, refer to FIG. 7, a cross-sectional view of an N-channel TFT according to fourth embodiment of the present invention is provided. The fourth embodiment differs from the third embodiment in that the source region comprises the highly doped source region 410b only. Refer to FIG. 8, a cross-sectional view of an N-channel TFT according to fifth embodiment of the present invention is provided. The fifth embodiment differs from the third embodiment in that a doped drain region 427 is formed between the lightly doped drain region 425b and highly doped drain region 420a. Furthermore, the dopant concentration of the doped drain region 427 is higher than that of the lightly doped drain region 425b and lower than that of the highly doped drain region 420a.

Figure 9:
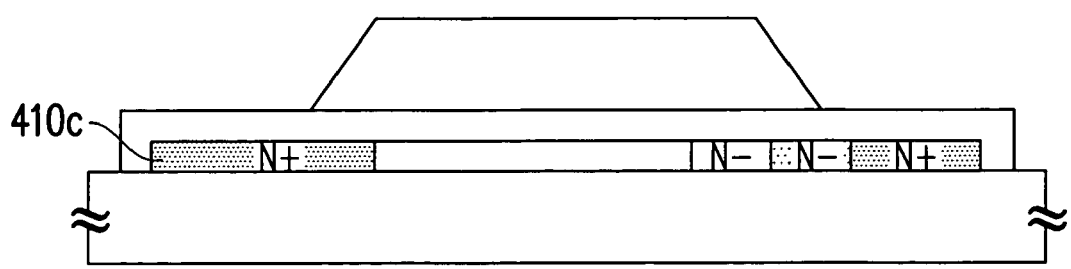
FIG. 9 is a cross-sectional view of an N-channel TFT according to sixth embodiment of the present invention.

FIG. 9 is a cross-sectional view of an N-channel TFT according to sixth embodiment of the present invention. The sixth embodiment differs from the fifth embodiment in that the source region comprises the highly doped source region 410c only.

There are many other N-channel TFT structures, capable of being achieved in accordance to the concept provided by the present invention; however we cannot mention all of them here. In summary, according to some embodiments of the present invention, since at least a part of the highly-doped source region is located under the gate region, the Vth (threshold voltage) variation can be reduced. Thus, the uniformity of TFT characteristics can be improved, thus improving luminance uniformity of OLED. Further, since at least a part of the lightly-doped drain region is located under the gate region, hot-carrier effect can be reduced and reliability of the TFT can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display apparatus, comprising:
a data driver for driving a plurality of data lines;
a scan driver for driving a plurality of scan lines; and
an active area, comprising a plurality of pixels, wherein at least one of the pixels comprises:
a control circuit, generating a data current in accordance to one of the data lines and one of the scan lines, the control circuit comprises at least one N-channel TFT which comprises:
a substrate;
an active layer on the substrate, wherein the active layer comprises an N type source region and an N type drain region;
a gate dielectric layer on the active layer; and
a gate region on the gate dielectric layer;
wherein the source region comprises a highly-doped source region, wherein at least a part of the highly-doped source region is located under the gate region,
wherein the drain region comprises a first doped drain region and a second doped drain region, wherein a dopant concentration of the first doped drain region is lower than the dopant concentration of the second doped drain region, wherein the first doped drain region is a lightly-doped drain region, wherein at least a part of the lightly-doped drain region is located under the gate region.

2. The N-channel TFT according to claim 1, wherein the drain region further comprises a third doped drain region, wherein the third doped drain region is formed between the first doped drain region and the second doped drain region, and the dopant concentration of the third doped drain region is between the dopant concentrations of the first/second doped drain regions.

3. The N-channel TFT according to claim 1, wherein the source region comprises a first doped source region and a second doped source region, a dopant concentration of the first doped source region is lower than the dopant concentration of the second doped source region, and the source region is extended so that a part of the second doped source region is under the gate region.

4. The N-channel TFT according to claim 3, wherein the source region further comprises a third doped source region, wherein the third doped source region is formed between the first doped source region and the second doped source region, and the dopant concentration of the third doped source region is between the dopant concentrations of the first/second doped source regions.

5. The N-channel TFT according to claim 1, wherein the highly-doped source region overlaps the gate region by at least 1 µm.

6. The N-channel TFT according to claim 5, wherein the highly-doped source region overlaps the gate region by 1 µm to 3 µm.

7. The N-channel TFT according to claim 1, wherein the lightly-doped drain region overlaps the gate region by at least 1 µm.

8. The N-channel TFT according to claim 7, wherein the lightly-doped drain region overlaps the gate region by 1 µm to 3 µm.

9. The display apparatus according to claim 1, wherein the control circuit comprises a driving TFT and the driving TFT is the N-channel TFT.

10. The display apparatus according to claim 1, wherein the control circuit comprises a switching TFT and the switching TFT is the N-channel TFT.

11. The display apparatus according to claim 1, wherein the display apparatus is an OLED display apparatus.

12. An electronic device, comprising:
an image generator, generating image signals used for displaying an image; and
a display apparatus, comprising:
a data driver for driving a plurality of data lines according to the image signals;
a scan driver for driving a plurality of scan lines; and
an active area, comprising a plurality of pixels, wherein at least one of the pixels comprises:
a control circuit, generating a data current in accordance to one of the data lines and one of the scan lines, the control circuit comprises at least one N-channel TFT which comprises:
a substrate;
an active layer on the substrate, wherein the active layer comprises an N type source region and an N type drain region;
a gate dielectric layer on the active layer; and
a gate region on the gate dielectric layer;
wherein the source region comprises a highly-doped source region, wherein at least a part of the highly-doped source region is located under the gate region,
wherein the drain region comprises a first doped drain region and a second doped drain region, wherein a dopant concentration of the first doped drain region is lower than the dopant concentration of the second doped drain region, wherein the first doped drain region is a lightly-doped drain region, wherein at least a part of the lightly-doped drain region is located under the gate region.

13. The electronic device according to claim 12, wherein the electronic device is a mobile phone, digital camera, PDA (personal digital assistant), notebook computer, desktop computer, television, car display, or portable DVD player.

14. The electronic device according to claim 12, wherein the drain region further comprises a third doped drain region, wherein the third doped drain region is formed between the first doped drain region and the second doped drain region, and the dopant concentration of the third doped drain region is between the dopant concentrations of the first/second doped drain regions.

15. The electronic device according to claim 12, wherein the source region comprises a first doped source region and a second doped source region, a dopant concentration of the first doped source region is lower than the dopant concentration of the second doped source region, and the source region is extended so that a part of the second doped source region is under the gate region.

16. The N-channel TFT according to claim 15, wherein the source region further comprises a third doped source region, wherein the third doped source region is formed between the first doped source region and the second doped source region, and the dopant concentration of the third doped source region is between the dopant concentrations of the first/second doped source regions.

17. The N-channel TFT according to claim 12, wherein the highly-doped source region overlaps the gate region by at least 1 µm.

18. The N-channel TFT according to claim 17, wherein the highly-doped source region overlaps the gate region by 1µm to 3 µm.

19. The N-channel TFT according to claim 12, wherein the lightly-doped drain region overlaps the gate region by at least 1 µm.

20. The N-channel TFT according to claim 19, wherein the lightly-doped drain region overlaps the gate region by 1 µm to 3 µm.

* * * * *